June 8, 1954 I. R. HOXIE, JR 2,680,788

CONSTANT GAIN VARIABLE BAND-WIDTH AMPLIFIER

Filed April 16, 1951

INVENTOR
Isaac R. Hoxie, Jr.
BY
Thomas M. Ferrill, Jr.
ATTORNEY

Patented June 8, 1954 2,680,788

UNITED STATES PATENT OFFICE 2,680,788

CONSTANT GAIN VARIABLE BAND-WIDTH AMPLIFIER

Isaac R. Hoxie, Jr., Rockville Centre, N. Y., assignor to The Sperry Corporation, a corporation of Delaware Application April 16, 1951, Serial No. 221,225

2 Claims. (Cl. 179—171)

The present invention relates to amplifying systems and to frequency selective signal transmission networks, and is particularly concerned with an amplifying system wherein the response frequency band or range may be controlled by electric potential variations.

In amplifier circuits for use in radio communication, in radar systems and navigation aids, and in measuring devices, it is often desirable to be able to increase or decrease the band-width of the amplifier at will. In most controllable band-width systems, the gain of the amplifier decreases as the band-width increases. Moreover, one or more mechanical manipulations are usually required for effecting changes of the band-width.

An object of the present invention is to produce an improved amplifier system with very flexible control characteristics.

A further object is to provide an amplifier system wherein the response band-width characteristics are controllable independently of the gain of the amplifier.

Yet a further object is to provide an amplifier system wherein the response band-width characteristics are controllable by variation of an electric potential in a high-impedance circuit.

Another object is to provide a multi-stage amplifier system wherein the gain factors of two successive stages may be varied inversely by a single potential control.

These and further objects and features of the present invention are realized through the construction of an amplifier employing, as cascade stages, a first amplifier stage of the anode load type, and a second amplifier stage akin to the "grounded-grid" type, wherein the input voltage is applied between the cathode and ground, and the grid is by-passed to ground.

The amplification of this second stage is varied, as by variation of the control grid bias, and the loading and band-width of the common load impedance circuit between the first and second stages is varied as a result. The gain of the first amplifier stage, in turn, is caused to vary substantially in inverse ratio to the gain of the second stage, and the over-all gain of the two stages accordingly remains substantially constant, independently of the band-width variations.

Figure 1:
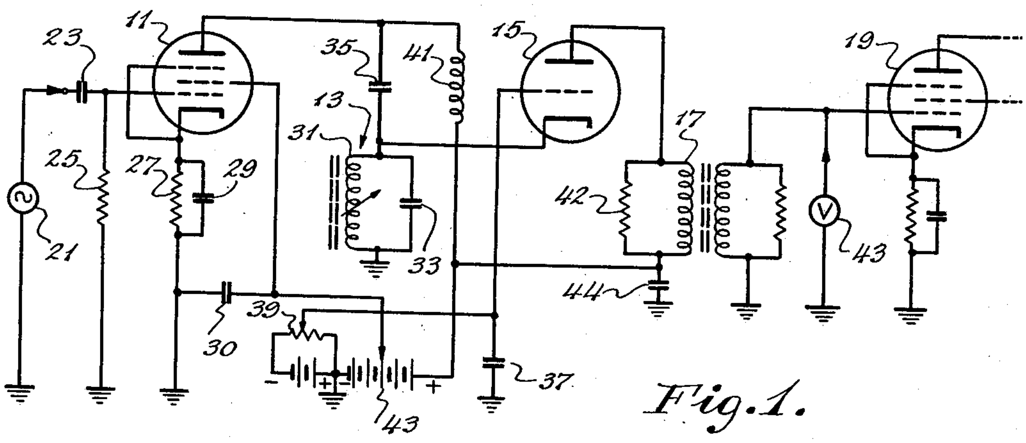
Figure 2:
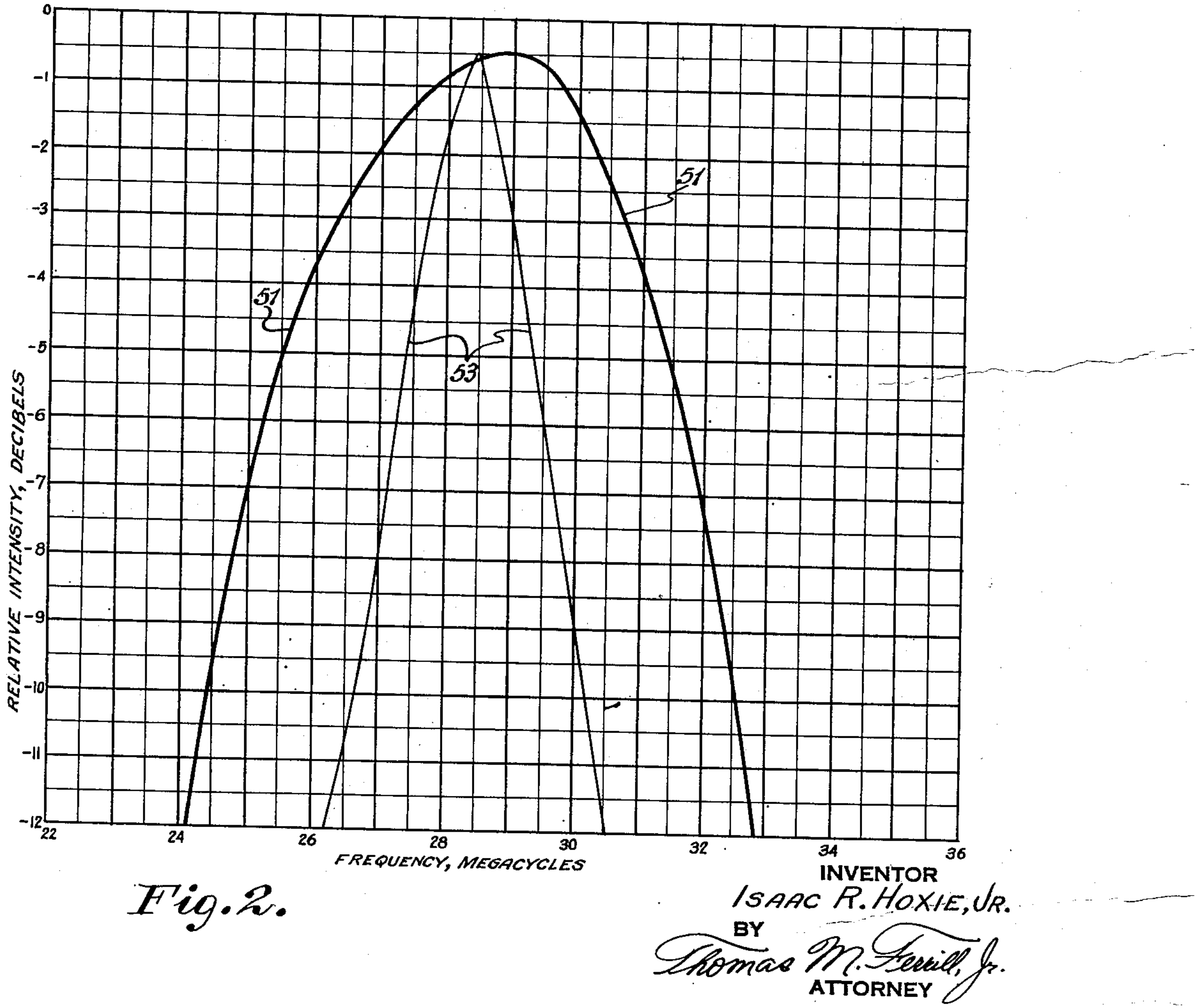

A circuit diagram of an embodiment of the invention is set forth in Fig. 1, and a set of illustrative performance curves are provided in Fig. 2.

Referring now to Fig. 1, a first amplifier stage including a pentode tube 11 is arranged with an anode load impedance circuit 13, which is connected in the cathode input circuit of a triode amplifier 15. Amplifier 15 is coupled through a broad-band transformer 17 to a further stage, indicated generally at 19.

A signal source 21 is coupled to the control grid of tube 11 through a capacitor 23, and a grid resistor 25 is provided for establishing average potential of the control grid of tube 11 at the D. C. potential of the ground system. A cathode bias resistor 27 is provided, and is by-passed by a capacitor 29.

The anode load impedance circuit 13 comprises a tunable inductor 31 and a capacitor 33 connected as a parallel-resonant circuit. The lower end of this resonant circuit is grounded. The upper end of the resonant impedance circuit 13 is coupled to the anode of tube 11 through a capacitor 35, and it is also connected to the cathode of tube 15.

The control grid of tube 15 is by-passed to ground through capacitor 37, and is connected to the movable arm of a potentiometer 39 which is supplied with negative bias with respect to ground.

The screen grid of tube 11 is by-passed to ground by a capacitor 39, and is connected to an intermediate potential point in the anode power source 43. The anode of tube 11 is supplied through a radio-frequency choke coil 41.

A voltmeter 43 is indicated as connected across the secondary of transformer 17. This voltmeter represents one illustrative type of utilization device which may be employed in connection with the amplified version of the voltage originating in generator 21.

The impedance circuit 13 serves not only as an anode load impedance for tube 11 but also as a cathode input coupling impedance for tube 15. Thus, it functions in the cathode-anode current circuits of both of these amplifier stages.

The gain of the first amplifier stage is directly proportional to the impedance magnitude presented between the upper terminal of circuit 13 and ground; and this impedance value, in turn, varies inversely according to the effective amplification factor of tube 15. Moreover, as the amplification factor of tube 15 is increased, causing a corresponding decrease of effective load resistance across resonant circuit 13, the band-width of the resonant circuit is increased.

By varying the magnitude of the negative bias applied to the control grid of tube 15, as by the manipulation of potentiometer 39, the amplification factor of this stage can be varied, producing the resultant inverse change of amplification of stage 11 and also producing the aforementioned change of response frequency band-width. As the negative bias value is increased, the effective amplification factor of tube 15 is reduced, and the effective loading of resonant circuit 13 is decreased (i. e. the resistance value effectively across this circuit is increased) with the consequence that amplifier stage 11 works into a higher impedance anode load and hence has higher gain. The reciprocally varying gain factors of stages 11 and 15 are substantially mutually compensating, so that the effective over-all change produced by the manipualtion of potentiometer 39 is a change of response frequency band-width, substantially free of change of over-all gain.

Fig. 2 illustrates a broad response curve 51 and a narrow response curve 53 produced by a single amplifier with two different settings of the potentiometer 39. It will be noted that the narrow response curve 53 is substantially centered with respect to the band limits of the broad response curve 51.

As the negatively biased grid circuit of tube 15 presents substantially infinite impedance to the bias control circuit, the band-width of the system may readily be controlled by a circuit supplying variable voltage, without the requirement of appreciable control power.

To cite one example of the many uses to which the present invention can be put, it is suitable for use in an intermediate-frequency amplifier such as the I. F. amplifier of a radar receiver. In such use, stages 11 and 15 may follow a chain of preceding I. F. amplifier stages having broad-band characteristics, and may be employed to enable the user to change the effective band-width of the amplifier system by operation of a switch or a gradual control such as potentiometer 39, or may be employed with an automatic voltage source connection to the grid of tube 15.

A table of values of the components of this system is given below, as a guide to construction of a similar system.

| | |
|---|---|
| Tubes: | |
| 11 | 6AU6 |
| 15 | 6C4 |
| Capacitors: | |
| 23 | .002 microfarad |
| 29 | .002 microfarad |
| 30 | .002 microfarad |
| 33 | 51 micromicrofarads (circuit capacity≅ 14 micromicrofarads) |
| 35 | .001 microfarad |
| 37 | .002 microfarad |
| 44 | .002 microfarad |
| Resistors: | |
| 25 | 10,000 ohms |
| 27 | 68 ohms |
| 39 | 10,000 ohms, potentiometer |
| 42 | 5,100 ohms |
| Inductors: | |
| 31 | 0.43 microhenries (Q=105) |
| 41 | 2.5 millihenry radio-frequency choke |
| Operating frequency | 28.5 megacycles |

It will be apparent that the band-width control action may be applied to wide-band audio amplifier systems as well as radio-frequency and intermediate-frequency amplifiers. For example, the common impedance between the two stages may be a resistance, for operation over a band of 40 to 12,000 cycles for example, for high-fidelity reproduction of music. For relatively low-amplitude passages, wherein background noise such as phonograph needle scratch noise would ordinarily be objectionable, the band-width of the two-stage amplifier would be narrowed by the operation of tube 15 with high negative bias and low amplification factor, the effective anode load impedance of tube 11 at medium and low frequencies being very high, and the higher frequencies being discriminated against by the shunting effect of the tube and circuit capacitance. During stronger passages of the music, the bias would be partly overcome and the gain of tube 15 would be increased, reducing the effective resistance value of the anode load impedance of tube 11, and bringing about not only reduced gain thereof but also a greatly extended response range of the amplifier.

As many changes could be made in the above construction and many apparently widely different embodiments of this invention could be made without departing from the scope thereof, it is intended that all matter contained in the above description or shown in the accompanying drawings shall be interpreted as illustrative and not in a limiting sense.

What is claimed is:

1. In combination, means including a first alternating voltage amplifier stage comprising an electron discharge tube having a cathode, a control-electrode, a screen-electrode, and an anode, means coupling said screen-electrode to a source of constant positive potential, said first amplifier stage producing an output voltage directly proportional to load impedance in its output circuit, means including a cathode input electron tube amplifier capacitively coupled to said first amplifier stage for providing a cathode input load impedance for the output circuit of said first amplifier stage, said cathode input electron tube amplifier having at least one control grid, means including a negative grid bias control voltage source connected to the control grid of said electron tube amplifier for varying the cathode input impedance of said electron tube amplifier and the amplification of said means including said electron tube amplifier inversely with each other, said means including said first alternating voltage amplifier stage and said means including said cathode input electron tube amplifier providing an over-all amplification of constant value as the cathode input impedance of said cathode input electron tube amplifier varies, means including a frequency-responsive network comprising a parallel resonant circuit of inductance and capacitance coupled in the cathode input circuit of said cathode input amplifier in parallel with said cathode input impedance, the band-width of said means including said first alternating voltage amplifier stage being determined by said frequency-responsive network and the value of said cathode input impedance, input circuit means providing a frequency band pass characteristic at least as broad as the band-width of said first amplifier stage when said cathode input impedance is at its lowest value, said input circuit means being coupled to the input of said means including said first alternating voltage amplifier stage, and output circuit means providing a frequency band pass characteristic at least as broad as the band-width of said first amplifier stage when said cathode input impedance is at its lowest value, said output circuit means being coupled to the output of said means including said cathode input electron tube amplifier.

2. The apparatus as defined in claim 1 wherein the impedance at resonance of said frequency-responsive network comprising said parallel resonant circuit of inductance and capacitance is large in comparison to said cathode input impedance.

References Cited in the file of this patent

UNITED STATES PATENTS

| Number | Name | Date |
|---|---|---|
| 2,008,996 | Suydam | July 23, 1935 |
| 2,463,229 | Wheeler | Mar. 1, 1949 |
| 2,489,266 | Cawein | Nov. 29, 1949 |